(12) United States Patent
Bluck (10) Patent No.: US 11,694,913 B2
(45) Date of Patent: Jul. 4, 2023

(54) HYBRID SYSTEM ARCHITECTURE FOR THIN FILM DEPOSITION

(71) Applicant: Intevac, Inc., Santa Clara, CA (US)

(72) Inventor: Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 454 days.

(21) Appl. No.: 16/716,173

(22) Filed: Dec. 16, 2019

(65) Prior Publication Data
US 2020/0194289 A1 Jun. 18, 2020

Related U.S. Application Data

(63) Continuation-in-part of application No. 16/583,165, filed on Sep. 25, 2019, now Pat. No. 11,414,748.
(Continued)

(51) Int. Cl.
*H01L 21/67* (2006.01)
*H01L 21/677* (2006.01)
(Continued)

(52) U.S. Cl.
CPC ........ *H01L 21/67173* (2013.01); *C23C 14/35* (2013.01); *C23C 14/566* (2013.01);
(Continued)

(58) Field of Classification Search
None
See application file for complete search history.

(56) References Cited

U.S. PATENT DOCUMENTS

| 5,618,388 A | 4/1997 | Seeser et al. |
| 5,798,027 A | 8/1998 | Lefebvre et al. |

(Continued)

FOREIGN PATENT DOCUMENTS

| JP | 2014-208577 A | 11/2014 |
| TW | 201032282 A | 9/2010 |

(Continued)

OTHER PUBLICATIONS

Examination Opinion of the Taiwan Intellectual Property Office for Taiwanese Patent No. 108146298, dated Nov. 3, 2020, pp. 3.
(Continued)

*Primary Examiner* — Jason Berman
(74) *Attorney, Agent, or Firm* — Womble Bond Dickinson (US) LLP; Joseph Bach, Esq.

(57) ABSTRACT

A processing system is provided, including a vacuum enclosure having a plurality of process windows and a continuous track positioned therein; a plurality of processing chambers attached sidewalls of the vacuum enclosures, each processing chamber about one of the process windows; a loadlock attached at one end of the vacuum enclosure and having a loading track positioned therein; at least one gate valve separating the loadlock from the vacuum enclosure; a plurality of substrate carriers configured to travel on the continuous track and the loading track; at least one track exchanger positioned within the vacuum enclosure, the track exchangers movable between a first position, wherein substrate carriers are made to continuously move on the continuous track, and a second position wherein the substrate carriers are made to transfer between the continuous track and the loading track.

20 Claims, 5 Drawing Sheets

Related U.S. Application Data (60) Provisional application No. 62/781,577, filed on Dec. 18, 2018.

(51) Int. Cl.
  *C23C 14/35* (2006.01)
  *H01L 21/683* (2006.01)
  *C23C 14/56* (2006.01)

(52) U.S. Cl.
  CPC .. *H01L 21/67178* (2013.01); *H01L 21/67196* (2013.01); *H01L 21/67201* (2013.01); *H01L 21/67706* (2013.01); *H01L 21/67712* (2013.01); *H01L 21/67742* (2013.01); *H01L 21/67778* (2013.01); *H01L 21/6831* (2013.01)

(56) References Cited

U.S. PATENT DOCUMENTS

| | | | |
|---|---|---|---|
| 6,132,562 | A | 10/2000 | Baumecker et al. |
| 6,273,955 | B1 | 8/2001 | Yoshino et al. |
| 6,335,054 | B1* | 1/2002 | Baumecker ............. C23C 14/56 118/723 VE |
| 9,914,994 | B2 | 3/2018 | Leahey et al. |
| 2003/0010449 | A1* | 1/2003 | Gramarossa ...... H01L 21/67748 156/345.31 |
| 2003/0136513 | A1* | 7/2003 | Lee .................. H01L 21/67748 156/345.31 |
| 2004/0037682 | A1 | 2/2004 | Yoshioka et al. |
| 2006/0028594 | A1 | 2/2006 | Chou |
| 2006/0291988 | A1* | 12/2006 | Machiyama ...... H01L 21/67276 414/792.7 |
| 2007/0183871 | A1 | 8/2007 | Hofmeister et al. |
| 2008/0166208 | A1 | 7/2008 | Lester |
| 2010/0265206 | A1 | 10/2010 | Chen |
| 2011/0097878 | A1* | 4/2011 | Olgado ............... C23C 16/4587 118/723 AN |
| 2011/0232844 | A1 | 9/2011 | Hofmeister et al. |
| 2012/0031335 | A1* | 2/2012 | Kurita ............... H01L 21/67712 118/723 R |
| 2012/0059502 | A1 | 3/2012 | Endo |
| 2013/0161183 | A1 | 6/2013 | Leahey et al. |
| 2013/0334031 | A1 | 12/2013 | Lee et al. |
| 2014/0161570 | A1 | 6/2014 | Hofmeister et al. |
| 2014/0311893 | A1 | 10/2014 | Shah et al. |
| 2015/0299470 | A1 | 10/2015 | Ngo et al. |
| 2015/0345007 | A1 | 12/2015 | Rogers et al. |
| 2016/0027623 | A1 | 1/2016 | Ishihara |
| 2017/0139085 | A1 | 5/2017 | Schürmann et al. |
| 2019/0025469 | A1 | 1/2019 | Bluck et al. |

FOREIGN PATENT DOCUMENTS

| | | |
|---|---|---|
| TW | 201335413 A | 9/2013 |
| WO | 2017072711 A1 | 5/2017 |

OTHER PUBLICATIONS

International Search Report and Written Opinion dated Mar. 4, 2020, for PCT/US2019/067235, filed Dec. 18, 2019, 7 pages.
International Search Report and Written Opinion dated Oct. 2, 2018, for PCT/US2018/042971, filed Jul. 19, 2018, 11 pages.
International Search Report and Written Opinion dated Mar. 9, 2020, for PCT/US2019/056823, filed Oct. 17, 2019, 13 pages.

* cited by examiner

HYBRID SYSTEM ARCHITECTURE FOR THIN FILM DEPOSITION

RELATED APPLICATIONS

This application is a continuation-in-part of U.S. application Ser. No. 16/583,165, filed on Sep. 25, 2019, the entire disclosure of which is incorporated herein by reference. This application also claims priority benefit from U.S. Provisional Application 62/781,577, filed on Dec. 18, 2018, the entire disclosure of which is incorporated herein by reference.

BACKGROUND

1. Field

This disclosure relates generally to the field of substrate processing, such as thin-film coating of substrates, especially of semiconductor wafers.

2. Related Art

Vacuum processing of substrates is well known in the art, and referred to sometimes as thin-film processing. Generally, thin-film processing systems may be classified under one of three architectures: batch processing, cluster systems, and in-line systems. The advantages and shortcomings of each of these architectures are well known in the art.

In some system architectures, especially those used for fabricating microchips using semiconductor wafers, the substrates are transported into the processing chambers individually by a robot arm, and are placed on a stationary chuck or a susceptor. Conversely, in other systems, e.g., those used for hard disk drive or solar cell fabrication, the substrates are transported and processed while positioned on transportable substrate carriers.

A need exists in the art for improved system architecture, which can be used for forming thin films on different types of substrates. Moreover, there's a need in the art for machinery that can form the thin-film coating at high throughput and a commercially acceptable cost.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide a system specifically designed to form an improved thin-film coating at high volume manufacturing and at an acceptable commercial cost. The disclosed system is particularly beneficial for forming multiple thin layers of different composition on top of a semiconductor wafers, such as for the manufacturing of MRAMs (Magnetoresistive Random-Access Memory).

In an MRAM cell data is stored by magnetic storage elements. The elements are formed from two ferromagnetic plates separated by a thin insulating layer. One of the two plates, called the reference layer, is a permanent magnet set to a particular polarity; while the other plate is the free plate, whose magnetization can be changed to match that of an external field to store memory bit. This configuration is known as a magnetic tunnel junction and is the simplest structure for an MRAM bit. An MRAM memory chip is built from a grid of such "cells". In actuality, each of the ferromagnetic plates is formed of several layers of thin films of different material composition, somewhat akin to a structure of a hard-drive disk.

Disclosed embodiments address two important elements of a vacuum processing system suitable for high-speed deposition of thin film layers: the architecture of the vacuum system and the architecture of the wafer loading system. The architectures are designed to solve various issues relating to sputtering thin films of magnetic material on round silicon wafers. Some of the issues include avoidance of water vapor reaching the layers, avoidance of particle contamination, and avoidance of wafer dislodge and breakage.

In the disclosed embodiments a vacuum enclosure has a plurality of processing chambers attached thereto. During processing carriers continuously move in unison inside the vacuum enclosure to be processed by the processing chambers. A loadlock section is attached to the vacuum enclosure and may have a loading side and an unloading side, which may share or have independent vacuum environment. Gate valves separate the loadlock section from the vacuum enclosure. Track exchangers are positioned within the vacuum enclosure. The track exchangers are movable between a first position, wherein carriers continuously move inside the vacuum enclosure, and a second position wherein the carriers are made to move between the vacuum enclosure and the loadlock section.

According to general aspects, a processing system is provided, comprising: a vacuum enclosure; a plurality of processing chambers attached to sidewalls of the vacuum enclosures; a transfer chamber coupled to a loading end of the vacuum enclosure via a first gate valve, the transfer chamber having transport tracks therein; a loadlock coupled to the transfer chamber via a second gate valve, and having a third gate valve at entrance side thereof, the loadlock having transport tracks therein; a wafer holding module attached to a sidewall of the loadlock and having a wafer holder holding the substrate in a vertical or near vertical orientation inside the loadlock; an articulated robot arm having an end effector attached at an end of the articulated robot arm via a rotatable wrist, the articulated robot arm positioned outside the loadlock and reachable for removing a substrate in a horizontal orientation from a FOUP, rotating the substrate towards vertical or near vertical orientation, and placing the substrate on the wafer holder; and, a plurality of substrate carriers traveling on the transport tracks and exchanging substrates with the wafer holding module.

The system may include a turntable having linear track sections provided thereupon. The turntable may be rotatable to transport the substrate carriers from an unloading position to a loading position or from one transport track to another transport track. The turntable may be positioned in the vacuum enclosure or inside the loadlock, and may also comprise motorized wheels.

The system may include a racetrack-shaped monorail positioned inside the vacuum enclosure; an endless belt positioned inside the vacuum enclosure and engaging carriers freely riding on the racetrack-shaped monorail; and track exchangers positioned at one end of the racetrack-shaped monorail and transporting carriers between the racetrack-shaped monorail and the transport tracks.

Each of the substrate carriers may comprise a wafer holder and/or an electrostatic chuck positioned at a near vertical orientation.

The system may include a turntable positioned at a terminus end of the vacuum enclosure, the terminus end opposite the loading end; a racetrack-shaped monorail positioned inside the vacuum enclosure; an endless belt positioned inside the vacuum enclosure and engaging carriers freely riding on the racetrack-shaped monorail; track exchangers positioned at one end of the racetrack-shaped monorail and transporting carriers between the racetrack-shaped monorail and the turntable; and, at least one second processing system attached to the vacuum enclosure at the terminus end. The endless belt may comprise a plurality of driving forks and each of the substrate carriers comprises a plurality of freely rotating wheels configured to engage the racetrack-shaped monorail and a driving pin configured to engage the driving forks. Also, the turntable may comprise linear track sections and motorized wheels, and each of the substrate carriers comprises a drive bar engaging the motorized wheels.

Further, the system may include a second transfer chamber coupled to the loading end of the vacuum enclosure; and, a second loadlock coupled to the second transfer chamber. A transport mechanism transports the carriers to the loadlock from the second loadlock, or to the transfer chamber from the second transfer chamber. The transport mechanism may comprise at least one track exchanger comprising a movable table, a straight monorail section positioned on the table, and a curved monorail section positioned on the table, and may further comprise a turntable having linear track sections positioned thereupon. The system may also include a monorail positioned inside the vacuum enclosure and formed as: a first monorail section shaped as a racetrack and a second monorail section having two parallel linear monorails extensions; a motive element positioned at the first monorail section; a plurality of motorized wheels positioned along the second monorail section; wherein the track exchanger transfers carriers between the first and second monorail sections. Each of the plurality of carriers may comprise: a base; an engagement mechanism attached to the base and configured to engage the motive element so as to move the carrier while in the first monorail section; and a drive bar attached to a base, the drive bar configured to engage plurality of motorized wheels so as to move the carrier while riding on the second monorail section.

According to further aspects, a processing system is provided, including a vacuum enclosure having a plurality of process windows and a continuous track positioned therein; a plurality of processing chambers attached sidewalls of the vacuum enclosures, each processing chamber about one of the process windows; a loadlock attached at one end of the vacuum enclosure and having a loading track positioned therein; at least one gate valve separating the loadlock from the vacuum enclosure; a plurality of substrate carriers configured to travel on the continuous track and the loading track; at least one track exchanger positioned within the vacuum enclosure, the track exchangers movable between a first position, wherein substrate carriers are made to continuously move on the continuous track, and a second position wherein the substrate carriers are made to transfer between the continuous track and the loading track.

In further aspects, a substrate processing system is provided, comprising:
a loadlock section having a first side and a second side opposite the first side;
an atmospheric section coupled to the first side of the loadlock section;
a vacuum section attached to the second side of the loadlock section and having a plurality of processing chambers attached thereto;
a carrier transport mechanism comprising:
   i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
   ii. a motive element positioned at the racetrack,
   iii. a plurality of motorized wheels positioned along the second monorail section,
   iv. two track exchangers positioned at one end of the first monorail section, each track exchanger comprising a movable table, a straight monorail section positioned on the table, and a curved monorail section positioned on the table,
and a plurality of carriers having a plurality of wheels and configured to engage the monorail to have the carrier ride on the monorail.

In one embodiment the system is made up of a loadlock section having a first side and a second side opposite the first side; an atmospheric section attached to the first side of the loadlock section; a vacuum section attached to the second side of the loadlock section and having a plurality of processing chambers attached thereto; a carrier transport mechanism comprising:
   i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
   ii. an endless belt positioned at the racetrack and having a plurality of drive forks attached thereto,
   iii. a driving wheel positioned in the atmospheric section and having a plurality of drive forks attached thereto,
   iv. a plurality of motorized wheels positioned along the second monorail section,
   v. two track exchangers positioned at one end of the first monorail section, each track exchanger comprising a movable table, a linear monorail section positioned on the table, and a curved monorail section positioned on the table,
a plurality of carriers, each carrier having a base, a plurality of wheels attached to the base and configured to engage the monorail to have the carrier ride freely on the monorail, a drive bar attached to the base, the drive bar configured to engage the plurality of motorized wheels so as to move the carrier while riding on the second monorail section, and a drive pin attached to the base and configured to engage the driving forks so as to move the carrier while in the first or third monorail section; and wherein when the track exchangers are in a first position the curved monorail section is aligned with the first monorail section causing the carriers to be continuously moved by the driving forks along the first monorail section, and when the track exchangers are in a second position the linear monorail section connects the first monorail section to the second monorail section causing carriers to be exchanged between the loadlock section and the vacuum section.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 1, 1A and 1B illustrate embodiments of a modular system for forming thin-film coatings using dual-motion carriers.

FIG. 2A illustrates one embodiment of a dual-motion substrate carrier, while FIG. 2B illustrates a substrate holder for round substrates.

FIGS. 3A-3B illustrate embodiments of an architecture configured for processing semiconductor wafers, while

DETAILED DESCRIPTION

Embodiments of the inventive system for fabricating thin-film coating and its wafer loading system will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Disclosed embodiments address two important elements of a vacuum processing system suitable for high-speed deposition of thin film layers: the architecture of the vacuum system and the architecture of the wafer loading system. The disclosure provided below begin with description of the vacuum processing system and then turns to description of the loading system.

Disclosed embodiments provide a system architecture that enables continuous processing of substrates inside a continuous pass-by processing section using a first mode of carrier motion, and a mechanism to transport the carriers out of the continuous pass-by processing section using a second mode of carrier motion. In either modes of carrier motion, the carrier freely rides on tracks, but the motive power applied to the carrier to make it ride on the tracks is different in each of the modes of carrier motion modes. While inside the continuous pass-by processing section, all of the carriers are moved in unison, but when exiting the continuous pass-by processing section, the carriers may be moved independently.

Figures 1, 2A, 2B:
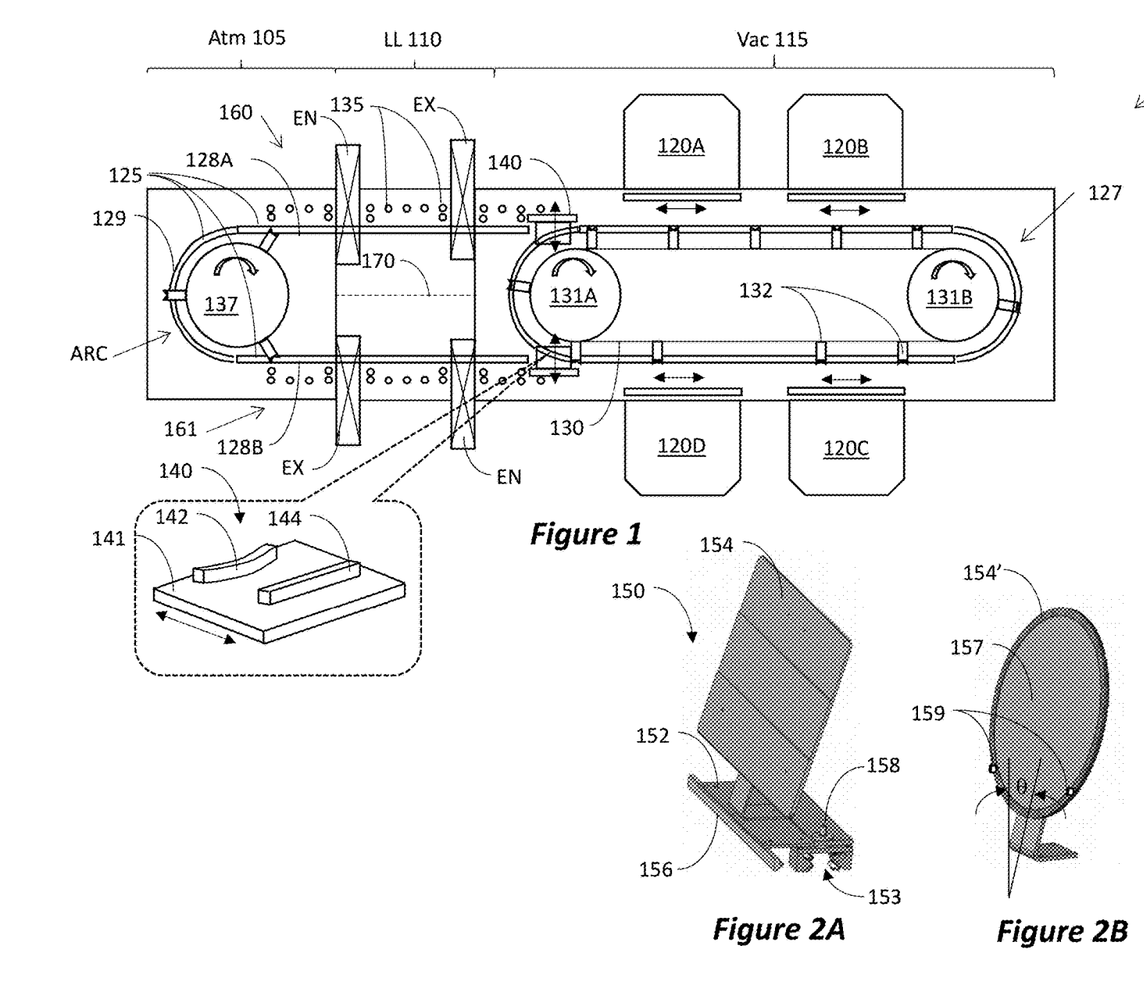

A first embodiment will now be described with reference to FIG. 1, in conjunction with FIGS. 2A and 2B, FIG. 2B being specific to processing semiconductor wafers. FIG. 1 illustrates a top schematic view of the system, while FIG. 2A illustrates a carrier and FIG. 2B illustrates a replacement substrate holder for the carrier of FIG. 2A.

In FIG. 1 the system 100 is made up of an atmospheric section 105, a loadlock section 110, and a vacuum section 115. The carriers are loaded and unloaded in the atmospheric section 105, and are transferred between the atmospheric section 105 and vacuum section 115 via the loadlock section 110. The substrates are processed inside the vacuum section 115, which forms the continuous pass-by processing section. In this example four processing chambers 120A-120D are illustrated, but any number of processing chamber may be provided, as will be shown further below. Each of the processing chambers 120A-120D may be an etch chamber, a sputtering chamber, an ion implant chamber, etc. As shown, in this embodiment the processing chambers are connected to a common vacuum atmosphere without valve gates between them and are configured for pass-by processing. For the MRAM fabrication, the chambers may be magnetron sputtering chambers with targets of different materials, such as cobalt (Co), tantalum (Ta), platinum (Pt), ruthenium (Ru), and alloy, such as cobalt-iron-boron (CoFeB), for forming to magnetic layers.

Monorail segments 125 are provided in the three sections, 105, 110 and 115, enabling a substrate carrier to traverse all three sections. The monorail segments form a racetrack monorail 127 inside the continuous pass-by processing section 115, form linear tracks 128A and 128B traversing the loadlock section 110, and extending partially into the atmospheric section and partially into the vacuum section, and forming a curved, crescent shaped, rotation track 129 in the atmospheric section 105. An endless belt 130 is provided over rotation drums 131A and 131B inside the continuous pass-by processing section 115, the endless belt 130 having a plurality of motive forks 132 attached thereto. A plurality of energized wheels 135 is provided next to the linear tracks, and a rotation wheel 137 with motive forks 132 is provided in the atmospheric section 105.

Two track exchangers 140 are provided inside the continuous pass-by processing section 115, an enlargement view of which is provided in the callout. The track exchanger comprises a table 141 upon which two track segments are provided, a curved track segment 142 and a straight track segment 144. As shown by the double-headed arrows in FIG. 1, the track exchanger is movable into one of two positions. In one position the curved track segment completes the racetrack 127, such that carriers within the vacuum section continuously move along the racetrack to continuously process substrates by chambers 120A-120D. When processing of the substrates within the vacuum chamber is completed, the track exchangers are moved to the second position, wherein the linear track forms a connection between the linear tracks 128A and 128B and the straight section of the racetrack 127, such that the carriers inside the vacuum chamber exit to the loadlock, while carriers inside the loadlock enter the vacuum section.

An embodiment of the substrate carrier 150 is illustrated in FIG. 2A. In this embodiment, the carrier 150 has a base 152 and a substrate holder 154. The substrate holder 154 is detachable from the base to enable processing of different shapes and number of substrates. For example, the holder 154 shown in FIG. 2A holds square or rectangle substrate in three levels, while the holder 154' shown in FIG. 2B holds a round substrate, such as a semiconductor wafer. In one embodiment, beneficial for MRAM fabrication, the holder 154' comprises an electrostatic chuck 157. Alternatively, or additionally, the holder 154'may comprise optional supporting pins 159 engaging the periphery of the wafer. Also, the plane of the holder is tilted an angle θ with respect to the horizontal. In this example, the angle is 15°.

As illustrated in FIG. 2A, the base 152 includes a roller arrangement 153 that engages and rides on the monorail 125. This roller arrangement is not motorized and may include a plurality of freely rotating wheels, such that the base can freely ride on the monorail. Motive power comes from either the wheels 135 engaging the drive bar 156, or one of the forks 132 engaging the drive pin 158.

An example of a generic process performed in the system 100 will now be described. An empty carrier is driven to the loading station 160, where the roller arrangement 153 engages the linear track 128A and motorized wheels 135 engage the drive bar 156. Fresh substrates are loaded onto the substrate holder 154. Meanwhile, processed substrates may be removed from another carrier positioned at the unloading station 161. Once loading and unloading is completed, entrance gate valve EN of the loadlock in the loading section 160 is opened. Optionally, the exit gate valves EX of the loadlock of the unloading section 161 is opened. The exit gate valve EX of the loading loadlock remains closed. Also, if the exit gate valve of the unload section is opened, then its entrance gate valve is closed. In some embodiments the two loadlocks are independent, as exemplified by the broken line partition 170, such that each can maintain vacuum independently of the other. In such a case, while fresh carrier is loaded into the loading loadlock, a processed carrier can be loaded from the vacuum section into the unloading loadlock 161. Note that entrance and exit gate valves are identified with respect to the carrier travel direction, although the structure of entrance and exit gate valves are the same. That is, if the travel direction would be flipped, the designation of entrance and exit valves would also be flipped.

In this condition the motorized wheels 135 are energized, such that a carrier in the loading station is transferred to the respective load lock, while a carrier inside the other loadlock can be moved to the atmospheric section 105 and/or a processed carrier can be moved into the unloading loadlock. Note, however, that it is not mandatory to perform these operations simultaneously. Alternatively, loading can be done separately in time, such that only the entrance valve of the carrier with the fresh substrates is opened and it is moved into the loadlock, while the motorized wheels in the unload section are not energized. That is, the motorized wheels in the linear track section can be energized independently or in groups, such that only a sub-group of the motorized wheels is energized. Also, when the loadlocks are independent, i.e., have independently dedicated pumping arrangement, then the various gate valves can also be energized independently, such that loading and unloading need not be synchronized. Of course, for operation efficiency, it is beneficial to synchronize operations.

In embodiments wherein the loadlocks maintain a common vacuum atmosphere and are commonly pumped, e.g., when there is no partition 170, the gate valves operate synchronously. For example, gate valve EN of the loading loadlock would operate together with the EX gate valve of the unloading loadlock, and the EX gate valve of the loading loadlock would operate together with the EN gate valve of the unloading loadlock.

When the carrier enters the loadlock, the entrance gate valve is closed and vacuum is drawn. If a processed carrier has been extracted out of the exit loadlock, then it also pumped to vacuum condition. When the appropriate vacuum level has been achieved, the exit gate valve EX of the loading load lock is opened, and the appropriate motorized wheels are energized to move the carrier into the vacuum section 115. At this time, the track exchanger 140 is moved to assume a position wherein the linear track section 144 is aligned with the straight section of the race track monorail 127. Consequently, when the wheels are energized to move the carrier into the vacuum section, the carrier enters the race track circuit, and one of the motive forks engages the drive pin 158. Then the track exchanger 140 is moved to assume a position wherein the curved track section 142 is aligned with the straight section of the race track monorail 127. In this position, the carrier is moved by the endless belt 130, not the motorized wheels 135. Also, in this condition, as the endless belt rotates, the carrier would travel along the racetrack as many circuits as needed, until it is ready to exit the processing section. Consequently, the substrates on the carrier can be repeatedly processed by each of chambers 120A-120D as many times as needed.

When processing is completed, the track exchanger 140 of the unload section is moved to assume a position wherein the linear track section 144 is aligned with the straight section of the race track monorail 127. As the endless belt continues to rotate, the carrier is moved into the track exchanger and disengages from the motive fork, while at the same time the drive bar 156 engages the motorized wheels 135. The motorized wheels can then be energized so as to drive the carrier out of the racetrack circuit.

As can be seen, in the embodiment described, the carrier has two modes of motive, engaging motorized wheel over the linear track, while engaging motive forks in the racetrack and in the atmospheric return circuit ARC. In the racetrack the forks are attached to an endless belt, while in the atmospheric return circuit the forks are attached to a driving wheel. Also, track exchangers are used to introduce or remove carriers into/from the racetrack. In one position the track exchanger enables the carrier to be driven endlessly around the race track, while in its second position it enables introducing or removing carriers into/from the racetrack.

Figure 1A:
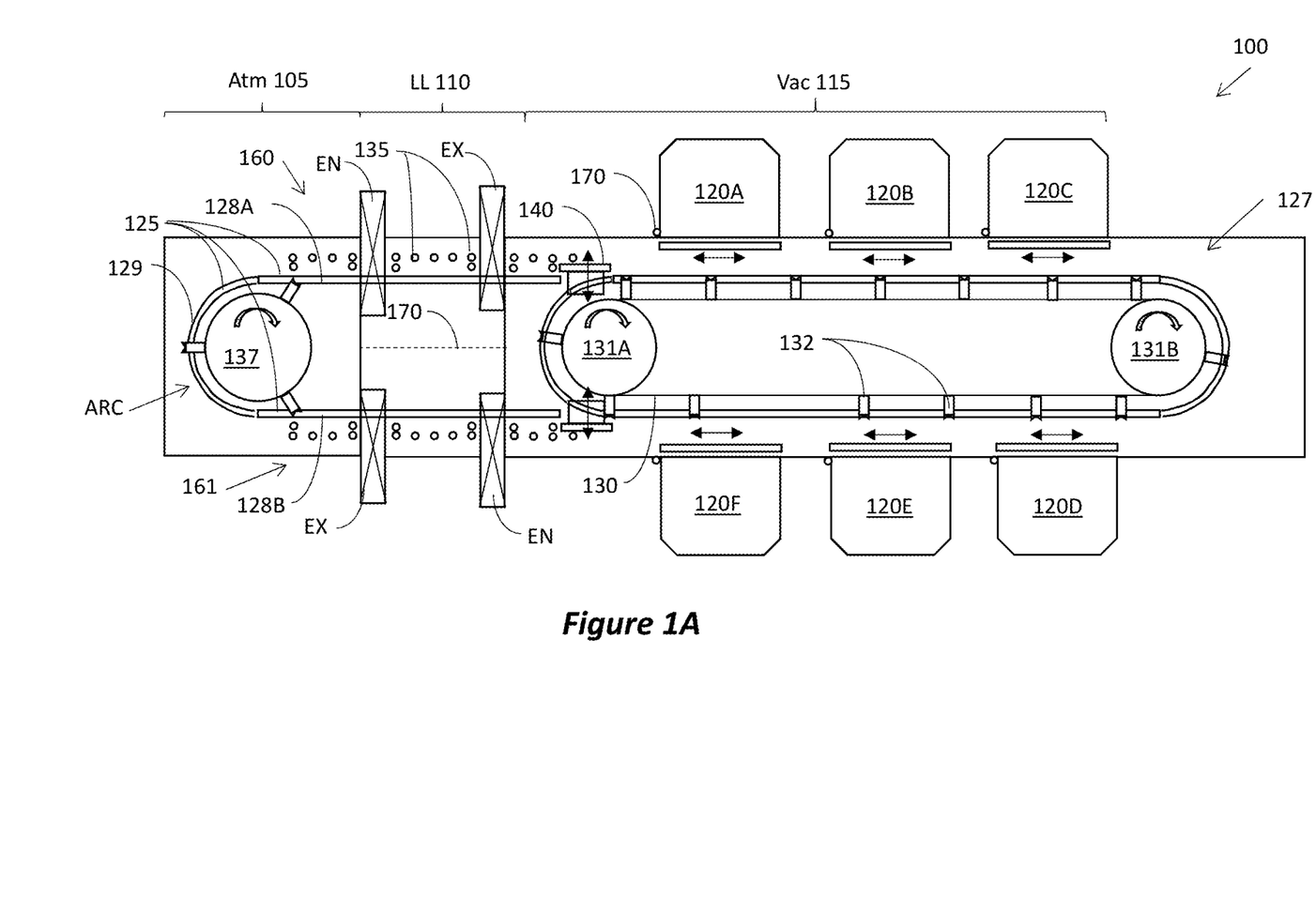

As noted previously, the system is adaptable to include as many processing chambers as necessary. An example is illustrated in FIG. 1A. The example shown in FIG. 1A is similar to that shown in FIG. 1, and similar elements are indicated by the same reference. The main difference is that the system of this example includes six processing chambers, 120A-120F. Otherwise, all of the elements may be the same as that of FIG. 1, illustrating the versatility of this architecture.

Figure 1B:
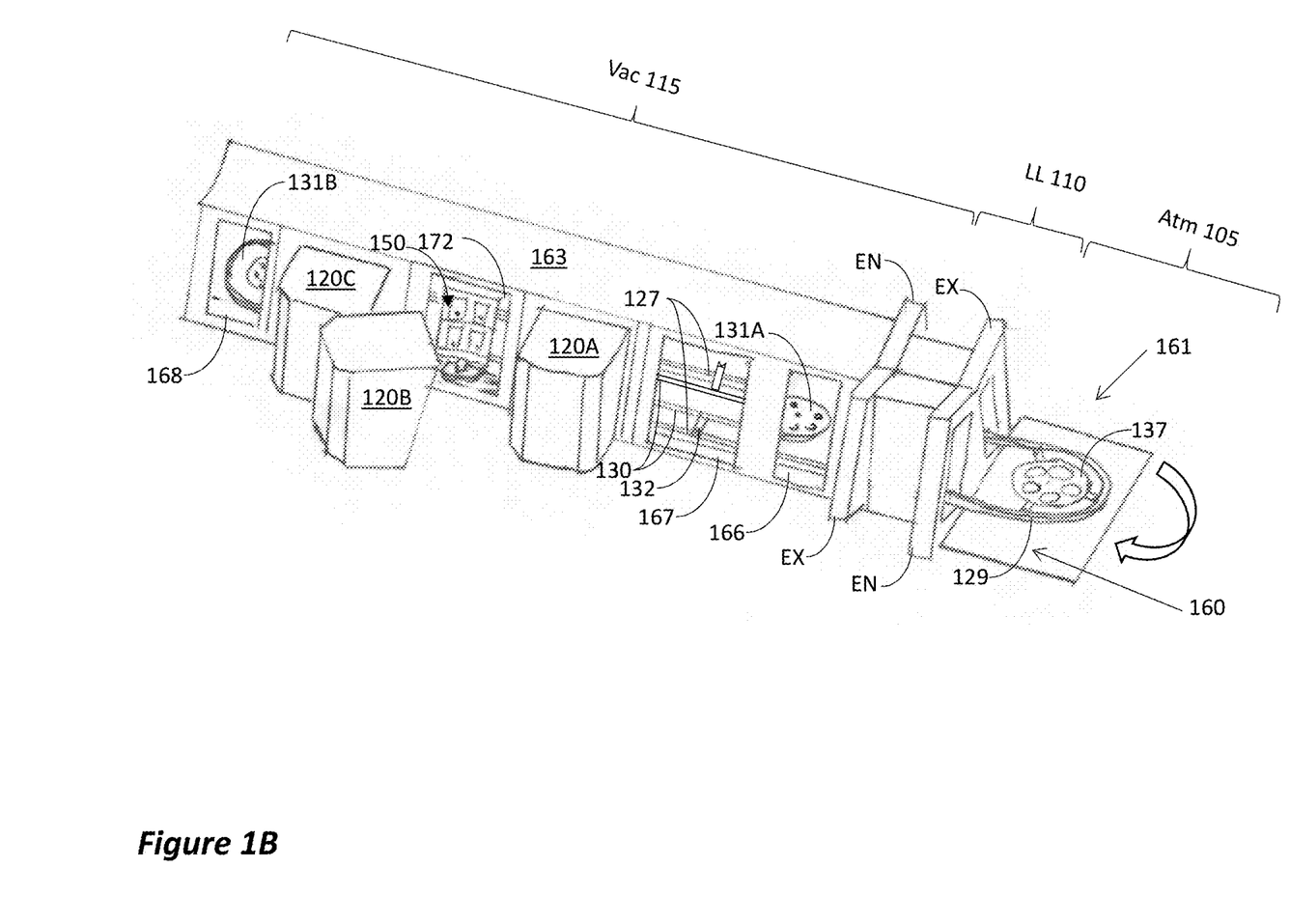

FIG. 1B provides an external view of an embodiment having six processing chambers, 120A-120C are visible in this perspective. Again, the system is made up of three sections: an atmospheric section 105, a loadlock 110, and a vacuum section 115, which includes the vacuum enclosure 163 onto which the processing chamber are attached. In the illustration the service access windows 166, 167 and 168 are shown open, to enable visualization of the interior of the vacuum enclosure. For example, rotation drums 131A and 131B can be seen from the service access windows 166 and 168, respectively. Parts of the racetrack monorail 127 and endless belt 130 are visible through the service access window 167.

In this example, chamber 120B is shown in an opened position, making easy access for service of the processing chamber and of the interior of the vacuum enclosure via process window 172. Specifically, in this example, the process chambers 120A-120C are attached to the vacuum enclosure 163 via a rotatable hinge 170 (obscured from view in FIG. 1B, but shown in FIG. 1A). As chamber 120B is rotated on its hinge, it exposes the interior of the vacuum enclosure 163, wherein a carrier 150 with four substrates is shown.

The architectures disclosed so far provide a substrate processing system having an atmospheric section 105; a loadlock section 110; and a vacuum section 115 having a plurality of processing chambers 120 attached thereto. A carrier transport mechanism comprises: a monorail formed as: first monorail section 127 shaped as a racetrack and positioned within the vacuum section, a second monorail section having two parallel linear monorails 128A and 128B positioned within the loadlock section and having extensions into the atmospheric section and the vacuum section, and a third curved monorail section, in the form of a crescent rotation track 129, positioned in the atmospheric section and having one end meeting the extension of one of the linear monorails and another end meeting the extension of another one of the linear monorails, an endless belt 130 positioned at the racetrack and having a plurality of drive forks 132 attached thereto, a driving wheel 137 positioned in the atmospheric section and having a plurality of drive forks 132 attached thereto, a plurality of motorized wheels 135 positioned along the second monorail section, and two tack exchanges 140 positioned at one end of the first monorail section, each track exchanger 140 having a movable table 141, a linear monorail section 144 positioned on the table, and a curved monorail section 142 positioned on the table.

A plurality of carriers support substrates to be processed, each carrier having a base 152, a plurality of free-rotating wheels 153 attached to the base and configured to engage the monorail to have the carrier ride freely on the monorail, a drive bar 156 is attached to the base, the drive bar configured to engage the plurality of motorized wheels 135 so as to move the carrier while riding on the second monorail section, and a drive pin 158 is attached to the base and configured to engage the driving forks 132 so as to move the carrier while in the first or third monorail section.

When the track exchangers are in a first position the curved monorail section is aligned with the first monorail section causing the carriers to be continuously moved by the driving forks along the first monorail section, and when the track exchangers are in a second position the linear monorail section connects the first monorail section to the second monorail section causing carriers to be exchanged between the loadlock section and the vacuum section.

A method for processing substrates in the disclosed processing system may include the steps comprising: loading the substrates onto a carrier; transporting the carriers over a transport track into a loadlock; pumping vacuum inside the loadlock; transporting the carrier on the transport track into a processing enclosure having a plurality of processing chambers attached thereto; operating a track exchanger to assume a first position thereby forming a connection between the transport track and a processing track, and moving the carrier on the track exchanger and thence to the processing track inside the processing enclosure; operating the track exchanger to assume a second position, thereby separating the processing track from the processing track; continuously moving the carrier on the processing track while energizing the processing chambers; and, when processing is completed, operating the track exchanger to assume the first position and transporting the carrier from the processing track onto the transport track. Continuously moving the carrier may comprise continuously moving a plurality of carriers in unison, e.g., by coupling the plurality of carriers to an endless belt.

The generic architecture of the system described so far can be used to process a variety of substrates. On the other hand, in order to process semiconductor wafers, e.g., for fabricating MRAMs, it is desirable to reconfigure the system so that it can be easily tailored for use in a wafer fabrication facility, generally referred to as a fab. In a fab, wafers are transported in FOUPs (Front Opening Universal Pod), which are specially designed cassettes, each holding multiple wafers. The following disclosure provide mechanism that enables transfer of wafers from FOUPs into the processing system described herein.

Figure 3A:
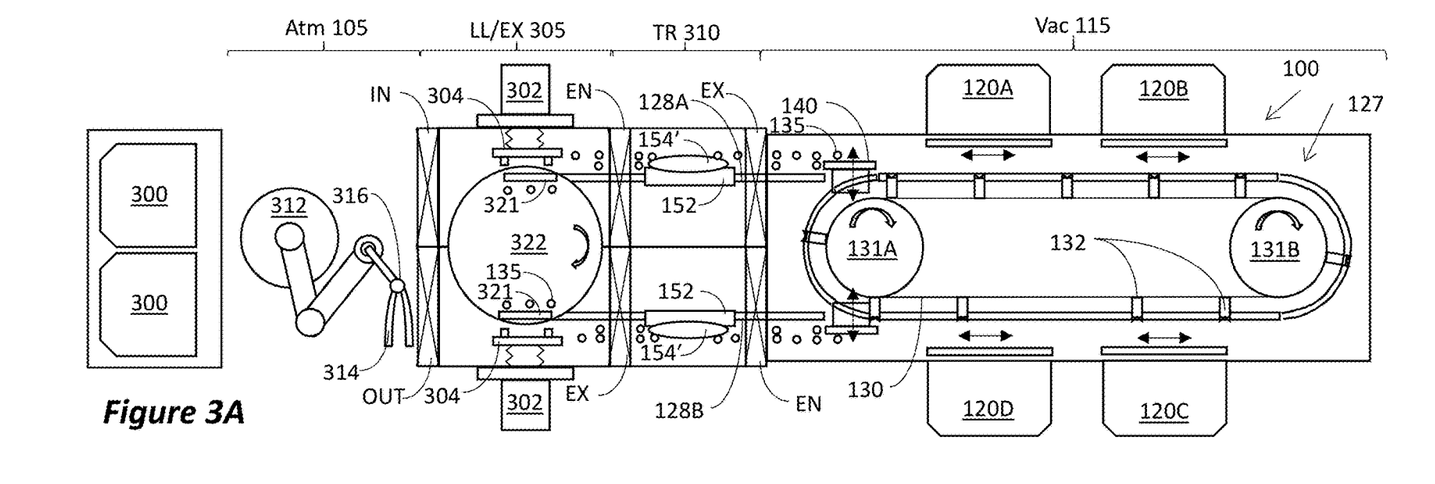

FIG. 3A illustrates an embodiment configured for processing semiconductor wafers. This embodiment is particularly beneficial for fabricating the magnetic layers of MRAMs on silicon wafers, but may be used for fabricating other devices on standard round silicon wafers. At this point, it is prudent to highlight three potential difficulties in fabrication of thin layers on round silicon wafers, and the manner in which the disclosed embodiments handle these difficulties.

The quality of the fabricated magnetic layers is very sensitive to contamination and, especially to water vapors. Therefore, disclosed embodiments are designed such that no part of the system's wafer transport mechanism exits the vacuum environment. This ensures that the carriers do not get contaminated in atmospheric environment. Also, since forming the magnetic layers require sputtering, which may cause particle contamination, inside the system the wafers travel in near vertical orientation, thereby reducing potential for particle contamination. Since the wafers are round and can be held only at the peripheral edge, holding the wafers at a vertical orientation inside the system is risky, as they are liable to be dislodged from the carrier. Therefore, within the system, the disclosed embodiments call for the wafers to be held on the carriers at near vertical orientation. In disclosed embodiments near vertical orientation refers to the wafers being held at 5-20 degrees tilt from the vertical, which while reducing potential for contamination, also reduces the potential for wafer dropping out of the carrier.

In FIG. 3A, elements similar to elements in FIGS. 1-1B are identified with the same numerals. Also, the continuous pass-by processing section indicated as Vac 115 is similar to that of FIGS. 1-1B. However, the arrangement of loading wafers into the vacuum environment of the continuous pass-by processing section 115 is different.

As indicated, inside the continuous pass-by processing section 115 the wafers travel in near vertical orientation. However, FOUPs in a fab store the wafers in a horizontal orientation. Thus, in addition to introducing the wafers into the vacuum environment of the processing system, the wafers also need to be rotated into a near vertical orientation. These objectives are achieved as follows.

The wafers are removed from and restocked in FOUPs 300 by a robot 312. In disclosed embodiments robot 312 is a SCARA (Selective Compliance Assembly Robot Arm) robot having an end effector 314 coupled to the robot arm by a rotating wrist 316. The rotating wrist 316 enables the end effector 314 to rotate the wafer between a horizontal orientation and a vertical orientation. The term end effector is used herein in its commonly accepted meaning, i.e., the last link of the robot arm which interacts with the work piece, in this case, the wafer. While any conventional end effector may be used, in disclosed embodiments the end effector may be impactive (physically grasping the wafer at its peripheral edge) or astrictive (using attractive force, such as vacuum or magneto/electro attractive force, to hold the wafer from its back surface).

Thus, for loading a fresh wafer into the system, the end effector assumes a horizontal orientation to remove a wafer from the FOUP 300. As the SCARA robot turns, the wrist 316 rotates to orient the wafer to vertical or near vertical position, i.e., to from 0 to 20° tilt from the vertical. Once the IN gate valve opens, the robot places the wafer on the wafer holding module 302 inside the loadlock/exchange chamber LL/EX 305. The wafer is positioned on the wafer holder 304 of the wafer holding module 302, at vertical or near vertical orientation, i.e., from 0 to 20° tilt from the vertical. The robot 312 is then retracted and the gate valve IN is closed. Vacuum can then be drawn inside the loadlock/exchange chamber LL/EX 305. Once vacuum is drawn, a transport carrier 150 is moved into a loading position in the loadlock/exchange chamber LL/EX 305 and the wafer is transferred from the wafer holder 304 onto the transport carrier 150.

As noted, in some embodiments the carrier 150 has substrate holder 154' which comprises an electrostatic chuck 157. In such embodiments, the method proceeds to having the end effector place the wafer onto the wafer holder 304 in an orientation having the device side of the wafer facing the wafer holder 304 and the backside of the wafer facing away from the holder 304. Then, when the carrier enters the loadlock 305, the electrostatic chuck is energized so as to chuck the wafer to the substrate holder 154' by the wafer's backside.

In this embodiment the wafer holding module 302 has a retractable wafer holder 304 that moves horizontally between first and second positions, i.e., an extended position and retracted position. One position is used for exchanging wafers with the robot 312, while the other position is for exchanging wafers with the carriers 150. Also, one position is for accepting wafers (from the robot in the case of loading fresh substrates, or from the carrier in the case of unloading processed substrates), while the other position is for dispatching wafers (to the carriers in the case of loading fresh substrates, or to the robot in the case of unloading processed substrates).

Depending on the particular architecture used, the carrier 150 may be moved into a loading position inside loadlock 305 from different locations and by different methods and routes. In the example shown in FIG. 3A, the carrier 150 is moved into a loading position by rotation of the turntable 322. This moves the carrier 150 from the unloading position to loading position. As will be described with respect to FIG. 3B, in another example the transport carrier 150 is moved from the transfer chamber TR310 into the loading position in loadlock/exchange chamber LL/EX 305. Conversely, as will be described with respect to FIG. 3C, in another example no turntable is used to move the transport carrier 150 into the loading position.

The turntable 322 includes linear track sections 321, enabling carriers to travel onto and off of the turntable 322 from the linear tracks 128A and 128B. Turntable 322 may also have motorized wheels, similar to wheels 135, to effect the linear motion of the carriers on linear track sections 321.

After the transport carrier 150 is loaded with a fresh wafer, the carrier 150 is moved into the transfer chamber 310 and gate valve EN can be closed for another loading cycle. After gate valve EN is closed, gate valve EX can be opened and the transport carrier 150 enters the continuous pass-by processing section 115. Processing of the wafer then proceeds as described above with respect to any of the disclosed embodiments, wherein the carrier enters the racetrack monorail and is moved around the racetrack circuit as many passages as needed.

Unloading is of course the reverse operation. The carrier with the processed wafer enters the transfer chamber 310, thence moves to unloading position on the turntable 322, wherein the wafer is loaded onto the wafer holder 304. The empty carrier is then moved to the loading position to accept a fresh wafer. Meanwhile, the SCARA robot is used to remove the wafer from the wafer holder 304 and place it in the FOUP 300.

Thus, a wafer loading system is disclosed, comprising: a robot arm having an end effector coupled to the robot arm via a rotating wrist; a loadlock chamber having a wafer holding module actuating a wafer holder; a transfer chamber abating the loadlock chamber; a gate valve positioned between the loadlock chamber and the transfer chamber; tracks traversing the loadlock chamber and the transfer chamber; and, wafer carrier riding on the tracks and configured to exchange wafers with the wafer holder. The wafer loading system may also comprise a turntable, the turntable having track sections positioned thereupon to accept carriers. The turntable may further comprise motorized wheels to move the carrier on the linear track sections. The carrier may be configured to freely ride on the tracks and be transported by motorized wheels. The carrier may further comprise an electrostatic chuck.

In order to move the transport carrier from the unload position to loading position, the transport carrier can be simply moved from the unloading position back into the continuous pass-by processing section 115 and, using the endless belt 130, the carrier can be moved around the racetrack and exit to the loading station. However, in the disclosed embodiments such transport process is avoided by, e.g., using the turntable 322. In the embodiment of FIG. 3A the turntable 322 is positioned inside the loadlock chamber. However, the turntable 322 can be positioned in other chambers of the system or eliminated altogether, as demonstrated below.

Figure 3B:
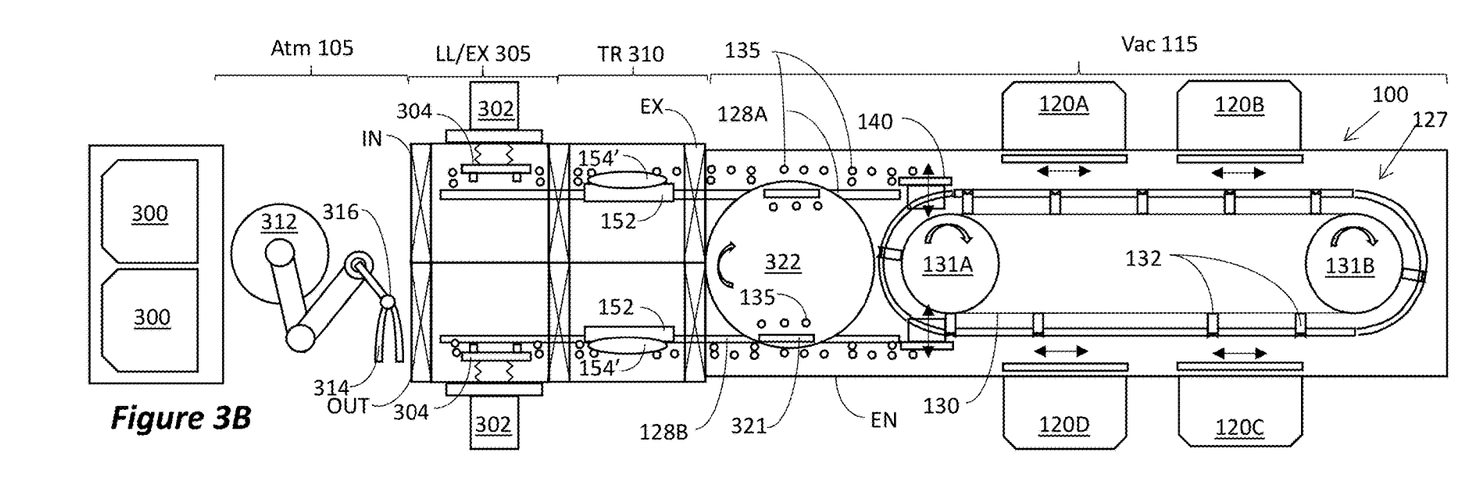

FIG. 3B illustrates another embodiment configured for processing semiconductor wafers. The embodiment of FIG. 3B is similar to that of FIG. 3A, except that the turntable 322 is positioned outside the loadlock chamber and the transfer chamber. In this example, the turntable is positioned between the transfer chamber 310 and the processing section 115, i.e., between the transfer chamber and the racetrack section. In another embodiment (not illustrated) the turntable 322 may be positioned inside the transfer chamber TR310.

Thus, the wafer loading system may further comprise a turntable having linear track sections thereupon. Alternatively, the processing chamber may further comprise a turntable having linear track sections thereupon. Still alternatively, a turntable having linear track sections thereupon may be positioned between the processing chamber and the wafer loading system.

Any of the embodiments described thus far may be coupled to other processing chambers and/or systems. One such example is provided in FIG. 3C. For clarity, the illustration of FIG. 3C omits parts of the loading section, but any loading section described in any of the embodiments detailed herein may be used for loading substrates into the system.

Figure 3C:
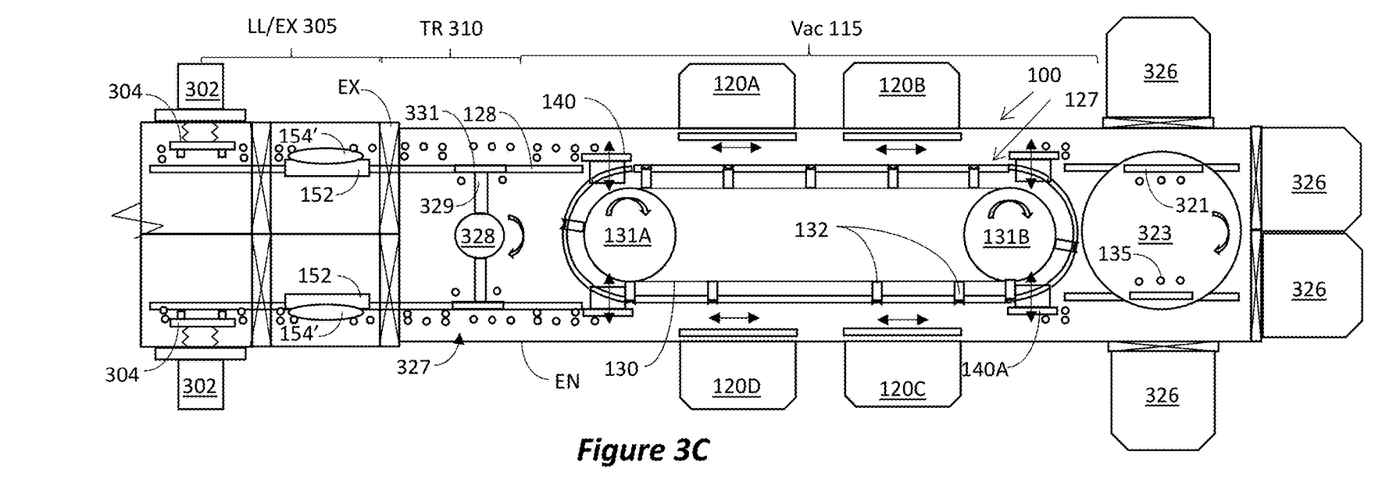
FIG. 3C illustrates an embodiment for attaching processing module at one end of the system.

A turntable 323 is positioned beyond the racetrack on the end-side opposite the loading side. Turntable 323 is configured to accept transport carriers from the racetrack and transport the carriers onto an attached processing chamber or processing system (e.g., a conventional mainframe processing system). In the illustration of FIG. 3C, any of elements 326 may indicate such processing chamber or processing system, e.g., a mainframe. The carriers 150 may be transferred from the racetrack monorail 127 onto the turntable 323 using track exchangers 140A arrangement, similar to track exchangers 140 arrangement on the opposite side. The turntable 323 includes linear track sections 321 to accept the carriers, and may also include motorized wheels 135 to move the carriers on linear track sections 321.

Also illustrated in FIG. 3C is a different structure of a turntable, which may be used in any of the disclosed embodiment and may also be referred to simply as a turntable. Specifically, turntable 327 is structures as a hub 328 having spokes 329. A linear track section 331 is attached to the end of each spoke 329. Each linear track section 331 is fit to form a continuation of tracks 128.

Figure 3D:
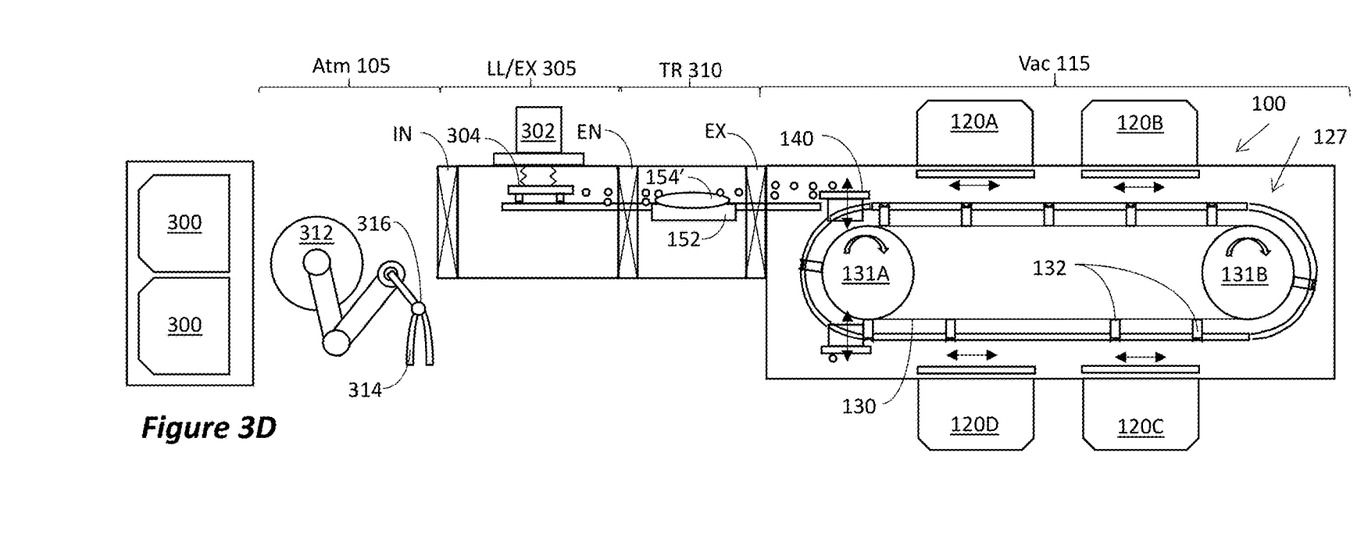
FIG. 3D illustrates a single loading/unloading arrangement that can be used to unload process wafer and then load fresh wafer.

In the embodiments of FIGS. 3A-3C separate loading and unloading arrangements are illustrated, with a turntable to move carriers from the unloading side to the loading side. However, this is not mandatory and instead a single arrangement can be used for loading and unloading. In situations when the processing sequence leaves sufficient time, a single loading/unloading arrangement can be used to unload process wafer and then load fresh wafer. An example is provided in FIG. 3D. After the loadlock 305 has been evacuated, gate valve EN is opened and a carrier 150 with processed wafer waiting in the transfer chamber 310 can be moved into the loadlock 305. The processed wafer is then moved from the carrier 150 to the wafer holder 304. Then the carrier can be returned to the transfer chamber 310 and gate valve EN is closed. The loadlock is then brought to atmospheric pressure and the IN gate valve is opened enabling the robot 312 to remove the processed wafer from the holder 304 and place a fresh wafer on the holder 304. The IN gate valve is then closed and vacuum is drawn in the loadlock 305. Gate valve EN is then opened and the carrier 150 moves back into the loadlock and loads the fresh wafer from the wafer holder 304. The carrier then returns to the transfer chamber and gate valve EN is closed. Gate valve EX is then opened and the carrier can proceed to be transferred onto the racetrack monorail 127 via the track exchanger 140.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A substrate processing system, comprising:
a vacuum enclosure;
a plurality of processing chambers attached to sidewalls of the vacuum enclosures;
a transfer chamber coupled to a loading end of the vacuum enclosure via a first gate valve, the transfer chamber having transport tracks therein;
a loadlock coupled to the transfer chamber via a second gate valve, and having a third gate valve at entrance side thereof, the loadlock having transport tracks therein, wherein substrates are transferred between atmospheric environment and vacuum environment via the loadlock;
a wafer holding module attached to a sidewall of the loadlock and having a wafer holder holding the substrate in a vertical or near vertical orientation inside the loadlock;
an articulated robot arm having an end effector attached at an end of the articulated robot arm via a rotatable wrist, the rotatable wrist enabling the end effector to rotate between a horizontal orientation and a vertical orientation, the articulated robot arm positioned outside the loadlock and reachable for removing a substrate in a horizontal orientation from a FOUP, rotating the substrate towards vertical or near vertical orientation, and placing the substrate on the wafer holder;
a plurality of substrate carriers traveling on the transport tracks in the transfer chamber and in the loadlock, and exchanging substrates with the wafer holding module.

2. The system of claim 1, further comprising a turntable having linear track sections.

3. The system of claim 2, wherein the turntable is rotatable to transport the substrate carriers from an unloading position to a loading position.

4. The system of claim 2, wherein the turntable is rotatable to transport the substrate carriers from one transport track to another transport track.

5. The system of claim 2, wherein the turntable is positioned in the vacuum enclosure.

6. The system of claim 2, wherein the turntable is positioned inside the loadlock.

7. The system of claim 2, wherein the turntable further comprises motorized wheels.

8. The system of claim 2, further comprising:
a racetrack-shaped monorail positioned inside the vacuum enclosure;
an endless belt positioned inside the vacuum enclosure and engaging carriers freely riding on the racetrack-shaped monorail;
track exchangers positioned at one end of the racetrack-shaped monorail and transporting carriers between the racetrack-shaped monorail and the transport tracks.

9. The system of claim 1, wherein each of the substrate carriers comprises an electrostatic chuck positioned at a near vertical orientation.

10. The system of claim 1, wherein each of the substrate carriers comprises a substrate holder positioned at a near vertical orientation.

11. The system of claim 1, further comprising:
a turntable positioned at a terminus end of the vacuum enclosure, the terminus end opposite the loading end;
a racetrack-shaped monorail positioned inside the vacuum enclosure;

an endless belt positioned inside the vacuum enclosure and engaging carriers freely riding on the racetrack-shaped monorail;

track exchangers positioned at one end of the racetrack-shaped monorail and transporting carriers between the racetrack-shaped monorail and the turntable; and, wherein at least one of the processing chambers is attached to the vacuum enclosure at the terminus end.

12. The system of claim 11, wherein the endless belt comprises a plurality of driving forks and each of the substrate carriers comprises a plurality of freely rotating wheels configured to engage the racetrack-shaped monorail and a driving pin configured to engage the driving forks.

13. The system of claim 12, wherein the turntable comprises linear track sections and motorized wheels, and each of the substrate carriers comprises a drive bar engaging the motorized wheels.

14. The system of claim 1, further comprising:
a second transfer chamber coupled to the loading end of the vacuum enclosure; and,
a second loadlock coupled to the second transfer chamber.

15. The system of claim 14, further comprising a transport mechanism transporting the carriers to the loadlock from the second loadlock.

16. The system of claim 14, further comprising a transport mechanism transporting the carriers to the transfer chamber from the second transfer chamber.

17. The system of claim 14, wherein the transport mechanism comprises at least one track exchanger comprising a movable table, a straight monorail section positioned on the table, and a curved monorail section positioned on the table.

18. The system of claim 17, wherein the transport mechanism further comprises a turntable having linear track sections positioned thereupon.

19. The system of claim 17, further comprising:
a monorail positioned inside the vacuum enclosure and formed as: a first monorail section shaped as a racetrack and a second monorail section having two parallel linear monorails extensions;
a motive element positioned at the first monorail section;
a plurality of motorized wheels positioned along the second monorail section;
wherein the track exchanger transfers carriers between the first and second monorail sections.

20. The system of claim 19, wherein each of the plurality of carriers comprises:
a base;
an engagement mechanism attached to the base and configured to engage the motive element so as to move the carrier while in the first monorail section;
a drive bar attached to a base, the drive bar configured to engage plurality of motorized wheels so as to move the carrier while riding on the second monorail section.

* * * * *